United States Patent
Jaeger et al.

(10) Patent No.: US 8,262,026 B2
(45) Date of Patent: Sep. 11, 2012

(54) RELEASABLE FASTENING OF A COMPONENT IN AN AIRCRAFT

(75) Inventors: Hartwig Jaeger, Jork (DE); Gerd Rohlfs, Jork (DE)

(73) Assignee: Airbus Operations GmbH (DE)

(*) Notice: Subject to any disclaimer, the term of this patent is extended or adjusted under 35 U.S.C. 154(b) by 496 days.

(21) Appl. No.: 12/361,767

(22) Filed: Jan. 29, 2009

(65) Prior Publication Data

US 2009/0189017 A1   Jul. 30, 2009

Related U.S. Application Data

(60) Provisional application No. 61/062,920, filed on Jan. 30, 2008.

(30) Foreign Application Priority Data

Jan. 30, 2008   (DE) .................... 10 2008 006 741

(51) Int. Cl.
*B64D 11/00* (2006.01)

(52) U.S. Cl. ............... 244/131; 244/118.2; 312/245; 312/322

(58) Field of Classification Search ............... 244/118.1, 244/118.2, 131; 312/322, 323, 325, 330.1, 312/349, 340, 245–248, 242, 321.5
See application file for complete search history.

(56) References Cited

U.S. PATENT DOCUMENTS

| | | | |
|---|---|---|---|
| 1,189,371 A * | 7/1916 | Lyons | 211/128.1 |
| 4,026,434 A * | 5/1977 | Howard | 220/478 |
| 4,458,296 A * | 7/1984 | Bryant et al. | 361/691 |
| 4,562,978 A | 1/1986 | Durbin et al. | |
| 4,720,622 A * | 1/1988 | Iwata et al. | 219/391 |
| 4,766,881 A * | 8/1988 | Pax | 126/299 R |
| 4,845,591 A * | 7/1989 | Pavie | 361/726 |
| 4,860,973 A * | 8/1989 | Fenner | 244/137.1 |
| 5,096,271 A | 3/1992 | Portman | |
| 5,129,594 A * | 7/1992 | Pease | 244/1 R |
| 5,170,320 A * | 12/1992 | Pease | 361/690 |
| 5,190,241 A * | 3/1993 | Pease | 244/1 R |
| 5,306,077 A * | 4/1994 | Trevaskis | 312/122 |
| 5,938,149 A | 8/1999 | Terwesten | |
| 5,954,410 A * | 9/1999 | Noellert | 312/242 |
| 6,073,624 A * | 6/2000 | Laurent | 126/334 |
| 6,088,239 A * | 7/2000 | Zeiss | 361/809 |
| 6,199,965 B1 * | 3/2001 | Kanbe et al. | 312/334.1 |
| 6,484,969 B2 * | 11/2002 | Sprenger et al. | 244/118.5 |
| 6,513,755 B1 | 2/2003 | Lambiaso | |
| 6,857,603 B2 * | 2/2005 | Lau et al. | 244/118.1 |
| 6,967,830 B2 * | 11/2005 | Cooper et al. | 361/679.32 |
| 7,246,865 B1 * | 7/2007 | Merrell, II | 312/248 |
| 7,726,606 B2 * | 6/2010 | Graf et al. | 244/118.5 |

(Continued)

FOREIGN PATENT DOCUMENTS

DE    19633469 C1    9/1997

(Continued)

*Primary Examiner* — Benjamin P Lee
*Assistant Examiner* — Joshua Freeman
(74) *Attorney, Agent, or Firm* — Lerner, David, Littenberg, Krumholz & Mentlik, LLP

(57) ABSTRACT

A device for the releasable fastening of a component in an aircraft includes a component carrier with a base plane, wherein the component carrier comprises an installation state in which the base plane of the component carrier comprises an angle relative to the horizontal base plane of the aircraft, and wherein the component carrier is equipped to accommodate a component in a releasably affixed manner.

18 Claims, 4 Drawing Sheets

U.S. PATENT DOCUMENTS

| | | | |
|---|---|---|---|
| 2002/0079792 A1* | 6/2002 | Nott et al. | 312/248 |
| 2004/0050569 A1* | 3/2004 | Leyda et al. | 174/50 |
| 2004/0140398 A1* | 7/2004 | Lau et al. | 244/118.1 |
| 2005/0236521 A1* | 10/2005 | Krause et al. | 244/118.1 |
| 2007/0095981 A1* | 5/2007 | Bock | 244/118.1 |
| 2008/0001031 A1* | 1/2008 | Doebertin et al. | 244/118.1 |
| 2008/0191093 A1* | 8/2008 | Benkart et al. | 244/118.1 |
| 2008/0273316 A1* | 11/2008 | Sarno et al. | 361/807 |
| 2008/0315036 A1* | 12/2008 | Wilcynski | 244/118.1 |
| 2009/0121080 A1 | 5/2009 | Feldkirchner et al. | |
| 2010/0007253 A1* | 1/2010 | Ryerson | 312/247 |
| 2011/0006158 A1 | 1/2011 | Jager et al. | |

FOREIGN PATENT DOCUMENTS

| | | |
|---|---|---|
| DE | 102007030330 | 1/2009 |
| GB | 2318277 | 4/1998 |
| WO | 98/17531 | 4/1998 |
| WO | 03/024175 | 3/2003 |
| WO | 2009/003763 | 1/2009 |

\* cited by examiner

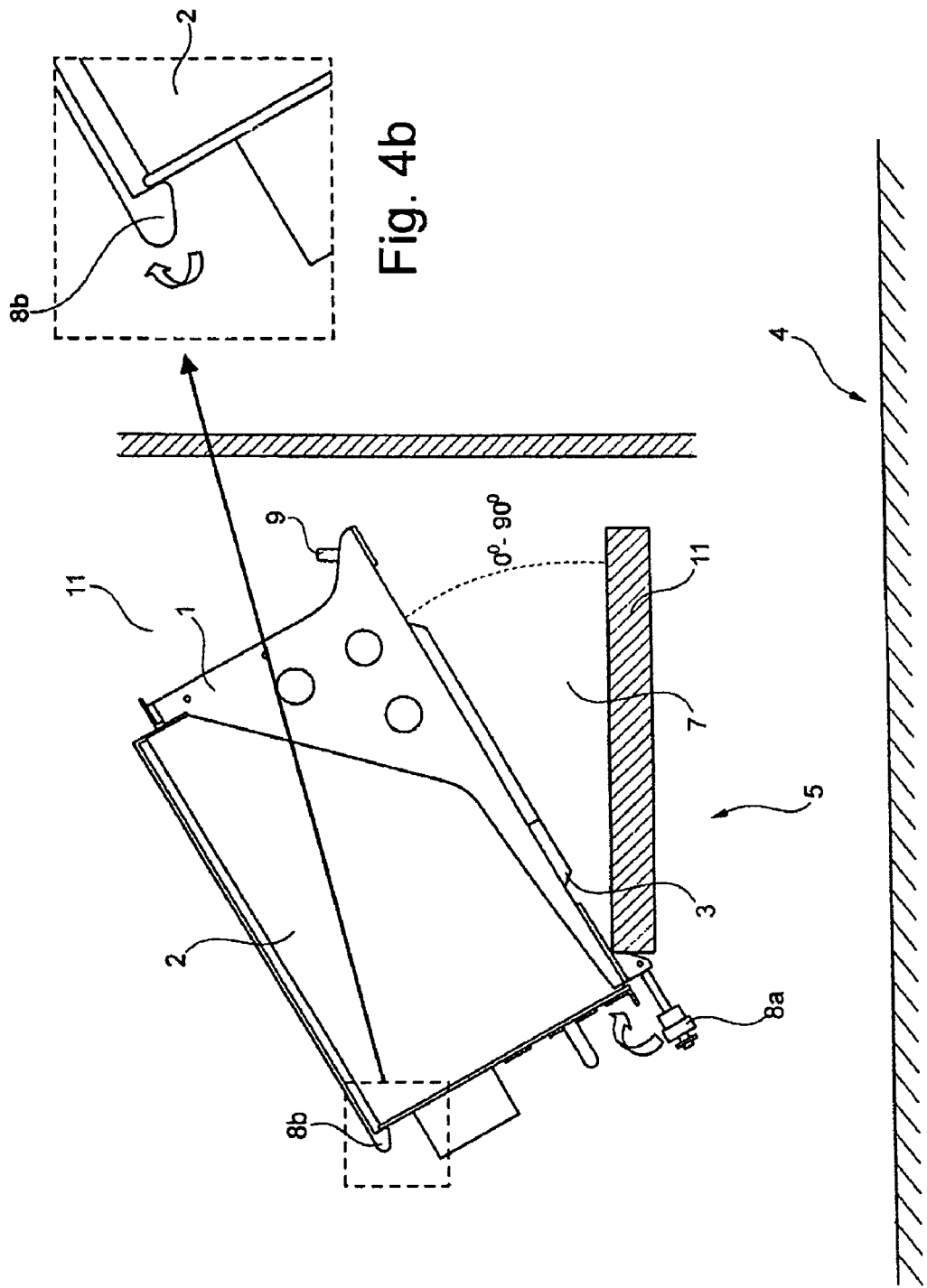

RELEASABLE FASTENING OF A COMPONENT IN AN AIRCRAFT

CROSS-REFERENCE TO RELATED APPLICATIONS

This application claims the benefit of the filing date of U.S. Provisional Patent Application No. 61/062,920 filed Jan. 30, 2008, the disclosure of which is hereby incorporated herein by reference.

BACKGROUND OF THE INVENTION

The invention relates to the fastening of components in an aircraft. In particular, the invention relates to a device for the releasable fastening of a component in an aircraft, to a system for the releasable fastening of a component, to an aircraft comprising a device according to the present invention, to the use of a device according to the present invention in an aircraft, as well as to a method for the releasable fastening of a component in an aircraft.

Known devices for the releasable fastening of a component in an aircraft provide the possibility on the one hand of safely stowing away components, while on the other hand keeping said components always accessible. However, known devices for the releasable fastening of a component, among other considerations, require considerable space and provide little in the way of flexibility.

BRIEF SUMMARY OF THE INVENTION

According to an exemplary embodiment of the present invention a device for the releasable fastening of a component in an aircraft, a system for the releasable fastening of a component in an aircraft, an aircraft comprising a device, a use of a device according to the present invention in an aircraft, as well as a method for the releasable fastening of a component in an aircraft, according to the independent claims, are provided.

Further embodiments of the present invention may be taken from the dependent claims.

According to an exemplary embodiment of the present invention a device for the releasable fastening of a component in an aircraft is provided, the device comprising a component carrier with a base plane, wherein the component carrier comprises an installation state in which the base plane of the component carrier comprises an angle relative to the horizontal base plane of the aircraft, and wherein the component carrier is arranged to accommodate a component in a releasably affixed manner.

This may provide for a user-friendly device for the releasable fastening of a component in an aircraft, which device requires less space.

According to a further exemplary embodiment of the present invention, a system for the releasable fastening of a component in an aircraft is provided, the system comprising a device for the releasable fastening of a component in an aircraft, as well as comprising a component, wherein the component may be placed in the component carrier, wherein the component is affixable in the component carrier in a releasably affixed manner, and wherein the component carrier with the placed component is displaceable between the installed state and the second state.

According to a further exemplary embodiment of the present invention, an aircraft with a device for the releasable fastening of a component is provided.

According to a further exemplary embodiment of the present invention, the use of a device for the releasable fastening of a component in an aircraft is provided.

According to a further exemplary embodiment of the present invention, a method for the releasable fastening of a component in an aircraft is provided, with the method comprising the steps of inserting a component in a component carrier, fixing the component to the component carrier, wherein the base plane of the component carrier in its installed state is arranged at an angle relative to the horizontal base plane of the aircraft.

In the context of further explanations the following definitions are used.

Component Carrier:

In the context of further explanations the term "component carrier" refers to any device that is suitable for accommodating or holding a component at least in part. In this arrangement holding may take place by a positive fit or by a non-positive fit. Accommodating or holding may take place by a matched geometric shape, onto or into which a component, which is described in more detail below, is placed or inserted, or further holding elements, locking elements, closing elements or connecting elements may be used to this effect.

Base Plane of a Component Carrier:

The term "base plane of a component carrier" may refer to any plane that can be used to place a component into or onto the component carrier. For example, the component carrier may comprise a U-shaped profile into which the component is subsequently placed. In such a case the base plane may refer to that side that is suitable for holding, guiding or placing the component. This may, for example, be an essentially downward pointing closed side of the component carrier. Moreover, the base plane may be purely virtual, for example in the case where the component is moved into the component carrier on lateral guide rails or the like, or guide rails or the like that are arranged at the top so that the side of the base plane that may be regarded as the bottom area may in this case be open.

Component:

The term "component" may refer to any element, device, unit or apparatus that is furthermore suited to being placed in a component carrier and there to be releasably affixed.

Horizontal Aircraft Base Plane:

Within the context of the present invention the term "horizontal aircraft base plane" essentially refers to the plane defined by the longitudinal direction of the aircraft, delimited by the longitudinal extension of the fuselage, and the aircraft's cross direction, which essentially results from the direction of extension of the wings. The horizontal base plane of the aircraft may regularly conform essentially to the floor, for example, of an aircraft cabin, or at least extend parallel to said floor.

In concrete terms, according to an exemplary embodiment of the invention, a device for the releasable fastening of a component in an aircraft is provided.

In this arrangement the preferred alignment of a base area of a component carrier may be non-parallel relative to a preferred further area, in the present case, for example, the horizontal base area of the aircraft.

This may result in an arrangement which when compared to a parallel arrangement of the two base planes in question requires less space.

As a result of this it may be possible to affix or place the device according to the present invention also to or in regions that, due to the confined or restricted space in this region, were not possible or suitable or intended for a conventionally designed device.

Furthermore, the component carrier may accommodate a component in a releasably fixed manner. In this arrangement the component is temporarily placed in the component carrier and fastened to, or with, the latter so as to effectively prevent any unintended falling out or sliding out.

For example, a storage container or any other type of receptacle or device may be placed in the component carrier in order to be securely held and thus securely stowed away for a certain period of time, for example of increased loads as a result of acceleration or deceleration.

In this way, unforeseen shock or pulse loads may also be effectively buffered; and loose, uncontrolled movement of the components may be prevented.

Further exemplary embodiments of the present invention are shown in the dependent claims.

Below, embodiments of the device according to the present invention for the releasable fastening of a component in an aircraft are described. However, these embodiments also apply to the system for the releasable fastening of a component in an aircraft, to an aircraft comprising a device according to the present invention, to the use of a device according to the present invention in an aircraft, as well as to the method for the releasable fastening of a component in an aircraft.

According to a further embodiment of the present invention, the angle between the base plane of the component carrier and the horizontal base plane of the aircraft ranges from larger than 0° to and including 90°.

As a result of such an arrangement of the component carrier it may, for example, be possible to affix said component carrier at an angle relative to the horizontal base plane of the aircraft. In a possibly rectangular design of the component carrier the latter may be able to be placed, affixed so as to be angled, with a reduced requirement for space.

Because of the resulting direction of extension non-parallel to the horizontal base plane of the aircraft, for example placed at that angle, the direction of longitudinal extension projected on the horizontal base plane of the aircraft shortens correspondingly. For example, a component carrier that is inclined upwards at an angle may significantly reduce the space required for installation in the horizontal planes of extension.

In this arrangement the base plane of the component carrier may correspond to a base plane of the component.

According to a further exemplary embodiment of the present invention, the angle between the base plane of the component carrier and of the horizontal base plane of the aircraft is designed so as to be variably adjustable.

It may thus be possible, dynamically and possibly at short notice, to change the inclination of the base plane of the component carrier, for example in order to adjust said base plane to changed circumstances. It may thus, for example, be possible in a rest state to increase the angle between the base plane of the component carrier and the horizontal base plane of the aircraft, so as to in this way initially further reduce the required space.

In a possibly subsequent case of need the previously mentioned angle may be reduced, for example in order to in this way place a component that requires a reduced angle of incidence. For example, an empty component in a rest state may be angled more than a full component in a second state, which is a demand state.

According to a further exemplary embodiment of the present invention, the component carrier further comprises at least one element selected from the group comprising a retention mechanism, a quick-connect element, a screw connection and a hold-down element.

As a result of such an element on the component carrier it may be possible to quickly and easily releasably affix or fasten a component placed in the component carrier. In this arrangement a retention mechanism may, for example, be a simple device that clicks over an elevation, thus providing resistance to any possible direction of movement.

Furthermore, by way of a corresponding element the component carrier may be kept in a releasably affixed manner in its installed state or in its second state.

According to a further exemplary embodiment of the present invention, the component carrier further comprises a contact element for coupling of the component.

In this arrangement the contact element may essentially be designed like a previously described holding/locking device or connecting element, or it may, for example, be designed as an electrical, pneumatic or hydraulic coupling or connection.

With the use of the contact element, the component may thus, for example, be supplied with electrical energy, or in this way a pneumatic or hydraulic coupling of a device placed in the component may be implemented. Thermal coupling, for example in the form of heating elements for heating or alternatively for cooling the component, may also be conceivable.

According to a further exemplary embodiment of the present invention, the component carrier further comprises a second state, in which the base plane of the component carrier is arranged so as to be essentially parallel relative to the horizontal base plane of the aircraft.

In this arrangement the second state may be implemented by sliding, by displacement or by some other movement, for example a rotary movement. Thus, again, a differentiation may be made between a rest state and a demand state. As an alternative, a differentiation may be made between a placement state and a rest state. For example, a component may be placed in the second state in the component carrier, which may subsequently be transferred to the installed state.

According to a further exemplary embodiment of the present invention, the component carrier is designed so as to be displaceable between the installed state and the second state.

With the use of two different states, the arrangement or alignment of the component carrier may be changed, adjusted and thus optimized depending on the situation or need.

According to a further exemplary embodiment of the present invention, the device further comprises a sliding element, wherein the component carrier is affixable to the sliding element and wherein the component carrier is displaceable with the use of the sliding element.

With the use of a sliding element the component carrier may, in a simple manner that is easy to implement, be arranged so as to be displaceable; the component carrier may thus conveniently be displaced between the installed state and the second state.

In this arrangement the sliding element may allow simple guidance of the component carrier in order to safely assume the two states. In this arrangement the sliding element may also implement start and/or end stops in order to prevent any overshooting of the two states.

In this way safety may be improved, and taking up the respective state may be facilitated. The sliding element may further comprise elements that affix the component carrier in its respective installed state or in its second state, and may prevent displacement without prior release of the element.

According to a further exemplary embodiment of the present invention, the component carrier is arranged as an ARINC tray, and the component is arranged as an ARINC device.

By such a, possibly standardized design, simple implementation of the device is possible, for example because standardized components may be used. Furthermore, it is imaginable that the component carrier is implemented as a plural number of interconnected ARINC trays, and/or is at least able to accommodate a plural number of components or ARINC devices.

According to a further exemplary embodiment of the present invention, the component carrier is affixable essentially in the region of the crown area.

In this arrangement the crown area may be a little used region in the aircraft or in the aircraft panelling, which region is essentially arranged in the upper region or in the head region or overhead region.

As a result of its arrangement near the curved outer shell of the aircraft the crown area may involve space restrictions that may be able to be optimally overcome with the use of a component carrier that is affixed at an angle. The available stowage space may thus be increased or optimized.

Below, an embodiment of the method according to the invention for the releasable fastening of a component in an aircraft is described. However, this embodiment also applies to the device for the releasable fastening of a component in an aircraft, to the system for the releasable fastening of a component in an aircraft, to an aircraft comprising a device according to the invention, and to the use of a device according to the invention in an aircraft.

According to a further exemplary embodiment of the present invention, the method according to the invention further comprises the step of displacing the component carrier to a second state with the use of a sliding element, wherein the component carrier is fastened to the sliding element.

By such a sliding element, displacement between the installed state and the second state may be implemented simply and conveniently.

BRIEF DESCRIPTION OF THE DRAWINGS

Exemplary embodiments of the present invention are shown in the following figures and are explained in more detail below.

It shows:

FIGS. 4a, b enlarged diagrammatic views of an exemplary embodiment of the present invention.

Identical or similar components in different figures are referred to with the same reference numerals.

The illustrations in the figures are diagrammatic and not to scale.

DETAILED DESCRIPTION

Below, illustrations of component carriers are described with reference to FIGS. 1a, b.

The component carrier 1 is affixed to a suitable position, for example in an aircraft. Said component carrier 1 is fastened to a module system 11 that is also fastened to a suitable position in the aircraft.

In this arrangement the component carrier 1 is placed on the module system and is subsequently fastened to said module system. The component carrier comprises an open design with a base plane 3 as well as a rear plane and two lateral supports.

The module system comprises lateral guide rails in order to reliably guide, hold and fasten the component carrier. The component carrier 1 comprises various openings, which allows, for example, to lead cabling in or through, or to supply or remove inflowing air or outgoing air. In this arrangement any inflowing air or outgoing air may be cooled or heated.

Figure 1A:
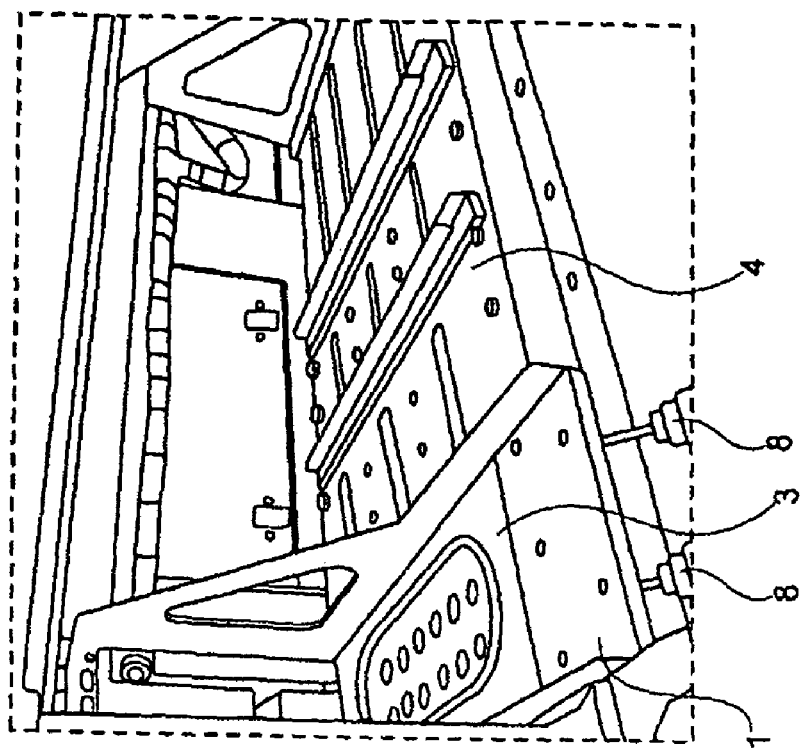
FIGS. 1a, b illustrations of component carriers.
Figure 1B:
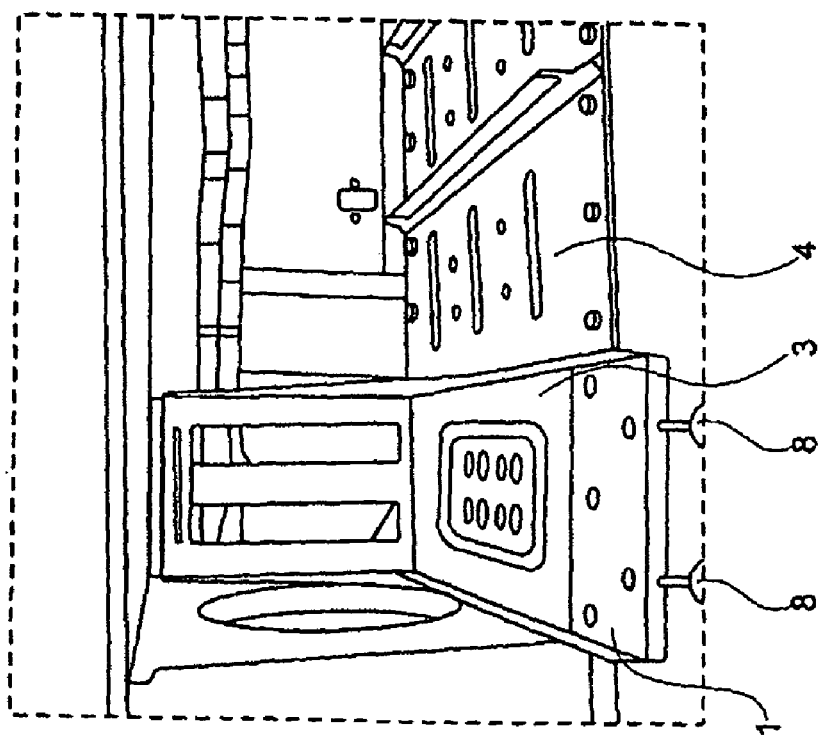

At its front at the bottom the component carrier comprises elements 8 that in FIGS. 1a, b are designed as hold-down elements or hold-down screws.

Figure 2:
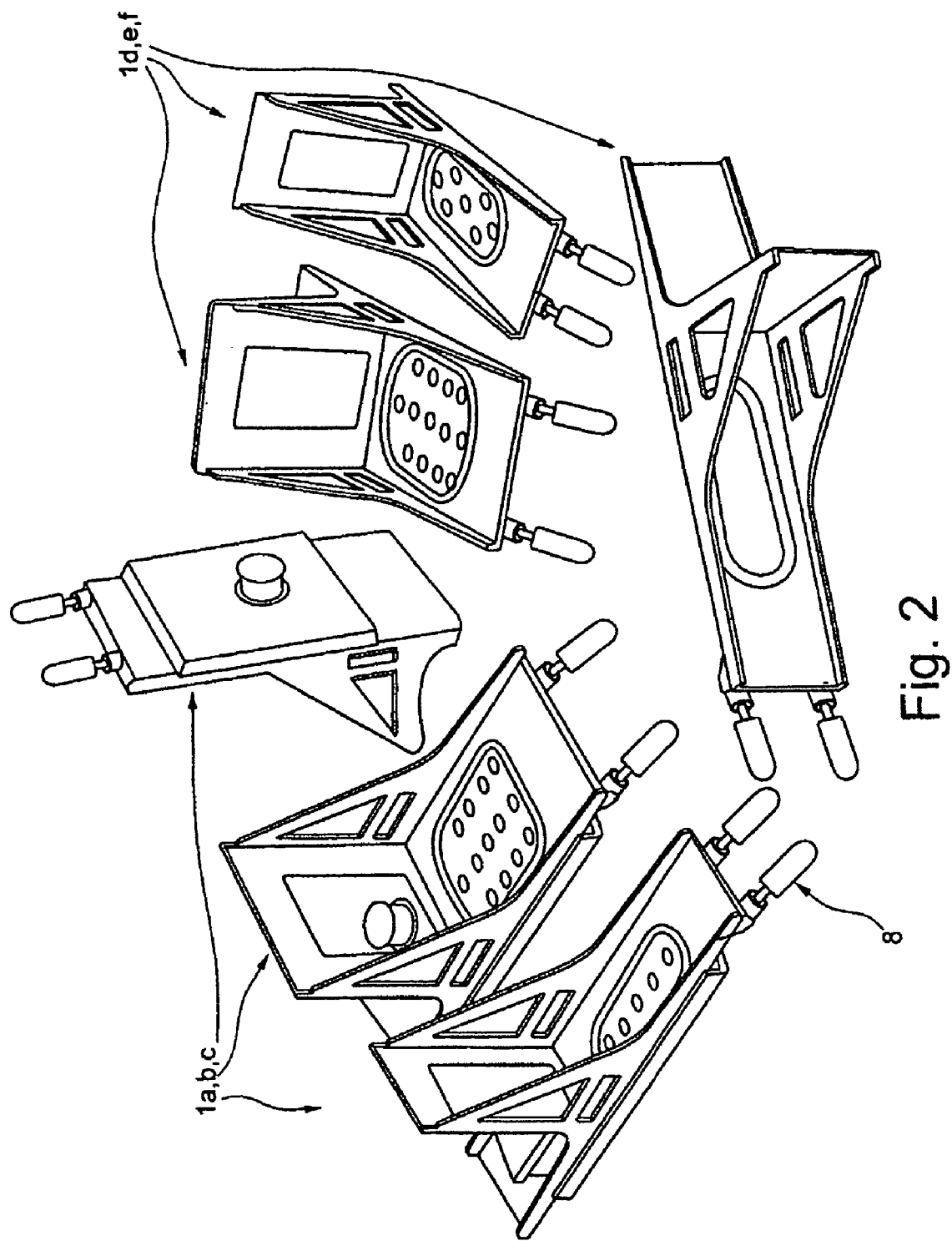
FIG. 2 different design variants of component carriers.

Furthermore with reference to FIG. 2, different embodiment variants of component carriers are described. Thus, FIG. 2 shows component carriers with ventilation 1a, b, c, as well as component carriers without ventilation 1d, e, f.

The component carriers may be used in different dimensions, which are, however, standardized per se. For example, there may be a specified form factor that represents a standard width of a component carrier.

Consequently, various component carriers may comprise a multiple of this form factor, for example ×2 (double form factor) in order to in this way ensure individual and variable occupation of the module system. In this arrangement, dimensions such as, for example, 1.5× the form factor or similar are also conceivable.

The component carriers in turn comprise hold-down elements or hold-down screws that in each case are fastened to the outsides of a component carrier, and through which hold-down elements or hold-down screws a component may be releasably affixed.

It is also imaginable to releasably affix the component carrier to the module system by way of the hold-down elements or hold-down screws.

Below, a diagrammatic illustration of an exemplary embodiment of the present invention is described with reference to FIG. 3.

Figure 3:
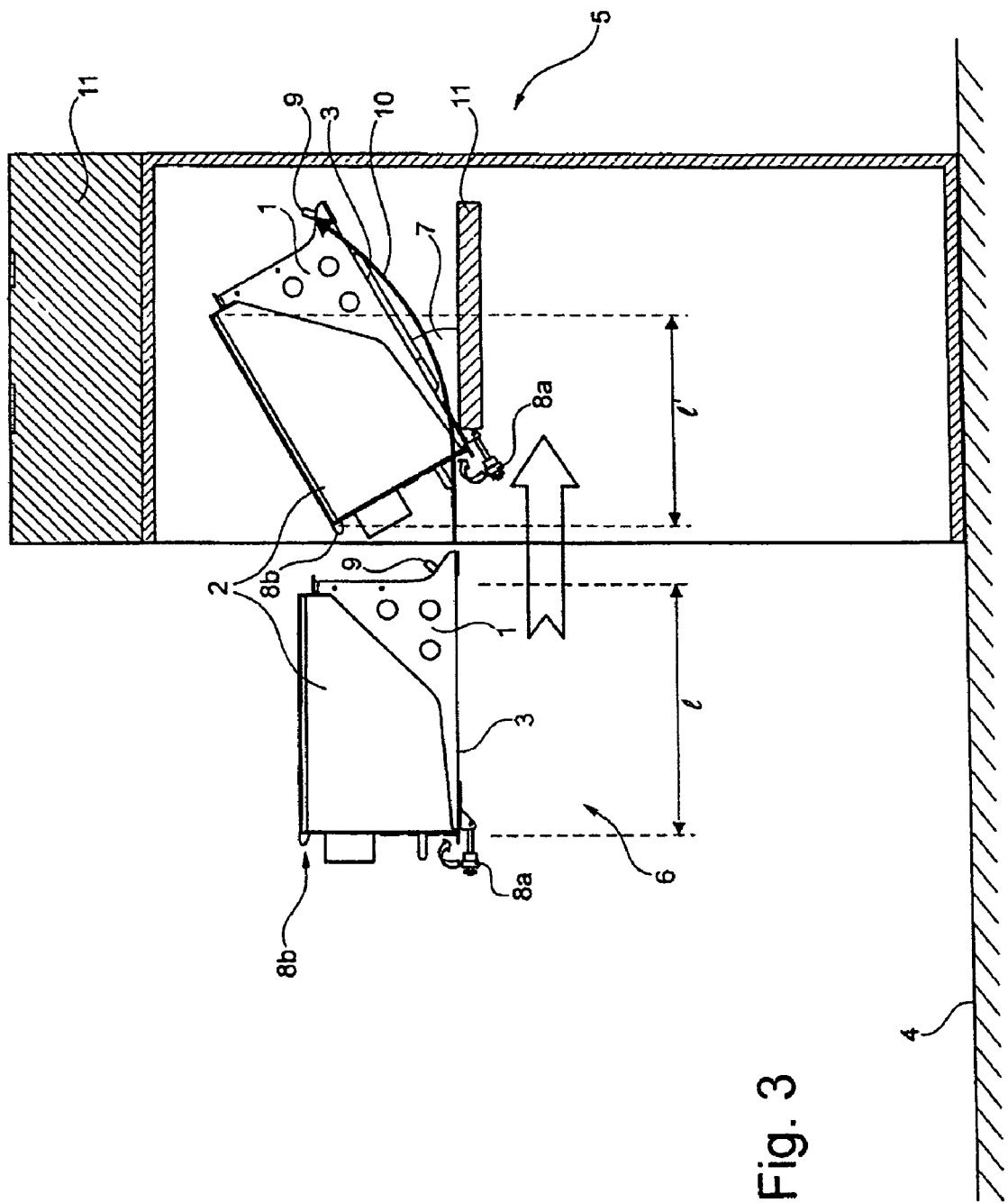
FIG. 3 a diagrammatic view of an exemplary embodiment of the present invention.

By way of an example, FIG. 3 shows a component carrier 1. A component 2 has been placed in the component carrier 1. In the second state 6 the base plane 3 is essentially parallel to the horizontal base plane 4 of the aircraft.

The component 2 is placed in the component carrier 1 and is releasably affixed in the component carrier with the use of the element 8b, in the diagram shown as a retention mechanism.

The component carrier further comprises the element 8a, which by way of an example is shown as a hold-down element or a hold-down screw. The component carrier may then be transferred from the second state 6 to the installed state 5.

In the installed state the component carrier is arranged at an angle 7 when compared to the second state, and thus also when compared to the horizontal base plane of the aircraft. In this arrangement the component carrier is inserted into the module system 11 or into the device carrier with the use of the sliding element 10.

In this arrangement the sliding element 10 may be designed as a simple linear guide-tilt system. By sliding the component carrier into the module system 11 or into the device carrier, the initial essentially horizontal movement is converted to a simultaneous vertical movement; thus a continuous tilt movement arises.

However, guiding that in some sections is linear is also conceivable.

In the installed state 5, i.e. in the state angled by the angle 7, the overall length of the component carrier 1, which length is projected to the horizontal base plane of the aircraft, is essentially shortened to a new overall length 1'. Consequently, the installed depth of the component carrier 1 and thus of the component 2 may be reduced in the installed state 5.

In the installed state 5 the element 8b affixes the component 2, thus preventing the component 2 from falling out or sliding out of the component carrier 1.

The component carrier 1 itself, in the installed state 5, is releasably affixed in the module system 11 or to the device carrier with the use of the element 8a.

In this arrangement a contact element 9 is arranged on the component carrier 1. The contact element 9 may, for example, establish an electrical or pneumatic or hydraulic connection between the component 2, which may comprise a counterpiece (not shown), on the one hand, and the aircraft systems on the other hand.

In this way a component 2 may, for example, obtain power for cooling or heating.

Furthermore, with reference to FIGS. 4a, b, enlarged diagrammatic views of an exemplary embodiment of the present invention are described.

FIG. 4a shows the component carrier 1 in the installed state 5. Accommodated in the component carrier 1 is the component 2, affixed in the installed state 5 with the use of the element 8b, in the diagram in an exemplary manner shown as a retention mechanism. FIG. 4b shows an enlarged detailed view.

Element 8a, in an exemplary manner shown as a hold-down element or hold-down screw, releasably affixes the component carrier in the angled slid-in installed state 5 in or on the module system 11.

The base plane 3 is arranged at an angle 7 relative to the horizontal base plane 4 of the aircraft.

Also shown is the contact element 9, arranged on the component carrier 1, which contact element 9 comprises a connection to the component 2 (not shown).

In addition, it should be pointed out that "comprising" does not exclude other elements or steps, and "a" or "one" does not exclude a plural number. Furthermore, it should be pointed out that characteristics or steps which have been described with reference to one of the above exemplary embodiments may also be used in combination with other characteristics or steps of other exemplary embodiments described above. Reference characters in the claims are not to be interpreted as limitations.

LIST OF REFERENCE CHARACTERS 1a-f Component carrier
2 Component
3 Base plane
4 Horizontal base plane of the aircraft
5 Installed state
6 Second state
7 Angle
8a, b Element
9 Contact element
10 Sliding element
11 Module system/device carrier

The invention claimed is:

1. A device for the releasable fastening of a component in an aircraft, the device comprising:
    a component carrier with a base plane;
    wherein the component carrier comprises an installed state in which the base plane of the component carrier comprises an angle relative to a horizontal base plane of the aircraft; and
    wherein the component carrier is equipped to accommodate a component in a releasably fastened manner,
    wherein the component carrier further comprises a second state, in which the base plane of the component carrier is arranged so as to be substantially parallel relative to the horizontal base plane of the aircraft; and
    wherein the component carrier is arranged so as to be displaceable between the installed state and the second state by a continuous tilt movement.

2. The device of claim 1, wherein the angle between the base plane of the component carrier and the horizontal base plane of the aircraft ranges from larger than 0° to and including 90°.

3. The device of claim 1, wherein the angle between the base plane of the component carrier and of the horizontal base plane of the aircraft is variably adjustable.

4. The device of claim 1, wherein the component carrier further comprises:
    at least one element selected from the group consisting of a retention mechanism, a quick-connect element, a screw connection and a hold-down element.

5. The device of claim 1, wherein the component carrier further comprises:
    a contact element for coupling the component.

6. The device of claim 5, wherein the contact element is configured as a connection selected from the group consisting of an electrical connection, a pneumatic connection and a hydraulic connection.

7. The device of claim 5, wherein the contact element is configured as a thermal coupling, said thermal coupling comprising at least one a heating element for heating the component and a cooling element for cooling the component.

8. The device of claim 1, further comprising:
    a sliding element,
    wherein the component carrier is affixable to the sliding element; and wherein the component carrier is displaceable with the use of the sliding element.

9. The device of claim 1, wherein the component carrier is configured as an ARINC tray, and
    wherein the component is configured as an ARINC device.

10. The device of claim 1, wherein the component carrier is affixable substantially in the region of a crown area.

11. The device of claim 1, wherein in the installed state, a first overall length of the component carrier, which length is projected to the horizontal base plane of the aircraft, is shortened to a second overall length, thereby reducing an installed depth and space requirements of the component carrier.

12. A system for the releasable fastening of a component in an aircraft, the system comprising:
    a device comprising a component carrier with a base plane;
    wherein the component carrier comprises an installed state in which the base plane of the component carrier comprises an angle relative to a horizontal base plane of the aircraft; and
    wherein the component carrier is equipped to accommodate a component in a releasably fastened manner;
    wherein the component carrier further comprises a second state, in which the base plane of the component carrier is arranged so as to be substantially parallel relative to the horizontal base plane of the aircraft; and
    wherein the component carrier is arranged so as to be displaceable between the installed state and the second state by a continuous tilt movement, and
    a component;
    wherein the component is placeable in the component carrier;
    wherein the component is affixable to the component carrier in a releasably fixed manner; and
    wherein the component carrier, with the placed component is displaceable between the installed state and the second state.

13. The method of claim 12, wherein in the installed state, a first overall length of the component carrier, which length is projected to the horizontal base plane of the aircraft, is shortened to a second overall length, thereby reducing an installed depth and a space requirement of the component carrier.

14. An aircraft comprising a device for the releasable fastening of a component in an aircraft, the device comprising:
   a component carrier with a base plane;
   wherein the component carrier comprises an installed state in which the base plane of the component carrier comprises an angle relative to a horizontal base plane of the aircraft; and
   wherein the component carrier is equipped to accommodate a component in a releasably fastened manner;
   wherein the component carrier further comprises a second state, in which the base plane of the component carrier is arranged so as to be substantially parallel relative to the horizontal base plane of the aircraft; and
   wherein the component carrier is arranged so as to be displaceable between the installed state and the second state by a continuous tilt movement.

15. The aircraft of claim 14, wherein in the installed state, a first overall length of the component carrier, which length is projected to the horizontal base plane of the aircraft, is shortened to a second overall length, thereby reducing an installed depth and a space requirement of the component carrier.

16. A method for the releasable fastening of a component in an aircraft, comprising:
   inserting a component in a component carrier;
   fixing the component to the component carrier; and
   wherein the base plane of the component carrier in its installed state is arranged at an angle relative to a horizontal base plane of the aircraft, wherein the component carrier further comprises a second state, in which the base plane of the component carrier is arranged so as to be substantially parallel relative to the horizontal plane of the aircraft; and
   wherein the component carrier is arranged so as to be displaceable between the installed state and the second state by a continuous tilt movement.

17. The method of claim 16, further comprising:
   displacing the component carrier to a second state with the use of a sliding element,
   wherein the component carrier is fastened to the sliding element.

18. The method of claim 16, wherein in the installed state, a first overall length of the component carrier, which length is projected to the horizontal base plane of the aircraft, is shortened to a second overall length, thereby reducing an installed depth and a space requirement of the component carrier.

* * * * *